United States Patent [19]
Okumura

[11] Patent Number: 5,517,150
[45] Date of Patent: May 14, 1996

[54] ANALOG SWITCH FORMED OF THIN FILM TRANSISTOR AND HAVING REDUCED LEAKAGE CURRENT

[75] Inventor: Fujio Okumura, Tokyo, Japan

[73] Assignee: NEC Corporation, Tokyo, Japan

[21] Appl. No.: 955,036

[22] Filed: Oct. 1, 1992

[30] Foreign Application Priority Data

Oct. 1, 1991 [JP] Japan .................................. 3-253272

[51] Int. Cl.$^6$ ............................................. H03K 17/687
[52] U.S. Cl. ....................... 327/427; 327/389; 327/431; 327/434; 327/437; 327/285; 327/288
[58] Field of Search ..................... 307/571, 572, 307/352, 353, 521, 304, 584, 581; 327/379, 389, 427, 431, 434, 436, 263, 264, 285, 288; 377/57

[56] References Cited

U.S. PATENT DOCUMENTS

| | | | |
|---|---|---|---|
| 3,222,610 | 12/1965 | Evans et al. ............................ | 307/571 |
| 3,532,899 | 10/1970 | Huth et al. ............................ | 327/389 |
| 3,614,476 | 10/1971 | Teranishi ............................ | 307/279 |
| 3,839,673 | 10/1974 | Acker ............................ | 307/353 |
| 3,922,567 | 11/1975 | Adam et al. ............................ | 377/57 |
| 3,942,039 | 3/1976 | Kikuchi et al. ............................ | 307/572 |
| 3,996,481 | 12/1976 | Chu et al. ............................ | 327/285 |
| 4,091,342 | 5/1978 | Whitten ............................ | 327/277 |
| 4,218,665 | 8/1980 | Fujisaki ............................ | 327/284 |
| 4,334,195 | 6/1982 | Luce ............................ | 307/353 |
| 4,719,374 | 1/1988 | Bialo ............................ | 307/571 |
| 4,721,871 | 1/1988 | Kiji et al. ............................ | 307/571 |
| 4,823,027 | 4/1989 | Takahashi ............................ | 307/353 |
| 4,886,986 | 12/1989 | Watanabe ............................ | 307/353 |
| 4,922,130 | 5/1990 | Swerlein ............................ | 307/353 |
| 5,010,408 | 4/1991 | Toohey ............................ | 307/353 |
| 5,162,670 | 11/1992 | Itakura et al. ............................ | 307/353 |
| 5,289,062 | 2/1994 | Wyland ............................ | 327/389 |

*Primary Examiner*—Terry Cunningham
*Attorney, Agent, or Firm*—Sughrue, Mion, Zinn, Macpeak & Seas

[57] ABSTRACT

An analog switch includes first and second thin film field effect transistors having their gate connected in common to a control terminal. Current paths of the first and second thin film field effect transistors are connected in series between an input terminal and a capacitive load. A voltage adjusting capacitive element is connected to a common connection between the current paths of the first and second thin film field effect transistors.

5 Claims, 11 Drawing Sheets

ANALOG SWITCH FORMED OF THIN FILM TRANSISTOR AND HAVING REDUCED LEAKAGE CURRENT

BACKGROUND OF THE INVENTION

1. Field of the Invention

The present invention relates to an analog switch, and more specifically to an analog switch used in sample-and-hold circuits and transfer gates for use in thin film integrated circuits composed of thin film transistors. In particular, the present invention relates to an analog switch which can be used as pixel switched in an active matrix type liquid crystal display, pixel switches in active matrix type vacuum fluorescent display panel, transfer gates of thin film shift registers.

2. Description of Related Art

Since thin film integrated circuits using thin film transistors have a feature that it can be directly formed on a glass plate, the thin film integrated circuits are actively developed as a key component of an active matrix type liquid crystal display, a contact type image sensor for facsimile, a thermal head of a printer, an input/output device of a liquid crystal shutter, etc. In particular, since the thin film transistors formed of polysilicon (polycrystalline silicon) can operate at a high speed, these thin film transistors can be frequently used in a driving circuit. A typical example of the driving circuit includes a shift register for a scanning circuit, a sample-and-hold circuit for holding a signal, and a transfer gate for transferring or switching a signal. In addition, these circuits include an inverter and an analog switch as an important component.

A basic structure of the analog switch includes a thin film field effect transistor having a current path connected at its end to a signal input terminal and at its other end to one end of a capacitive load (for example, a capacitor for storing a signal electric charge. The other end of the capacitive load is connected to a terminal for a reference voltage. A gate of the thin film field effect transistor is connected to receive a control voltage signal. Thus, by controlling the control voltage signal to the gate of the transistor connected between the signal input terminal and the load, an input signal is transferred to the load, or the input terminal is isolated from the load.

However, the conventional analog switch has a serious problem in which a substantial leakage current flows when the polysilicon thin film field effect transistor is turned off, and a voltage of the stored signal varies due to the leakage current. An ideal condition for the analog switch is that an ON current is large and an OFF current is small. The polysilicon thin film field effect transistor has a characteristic in which when the gate voltage is positive, a large current will flow as a matter of course, and when gate voltage is substantially at zero, the current becomes minimum. However, when the gate voltage is negative, a non-negligible off current will flow, and the larger the negative gate voltage becomes, the larger the off current becomes. This phenomenon is inherent to the polysilicon thin film field effect transistor, and a cause for deterioration in the voltage holding characteristics.

In order to overcome the above mentioned problems, various analog switches have been proposed. However, none of the proposed analog switches could have completely satisfied a required performance. In some application fields, it is required to precisely hold the signal for a relatively long period of time. In such a situation, none of the proposed analog switches sufficiently suppress the leakage current, and an error has frequently exceeded a permissible extent.

In addition, in order to realize a faster operation, the capacitance of the load for the analog switch has to be made as small as possible. However, if the capacitance of the load is made small, the voltage holding characteristics will be sacrificed. Furthermore, for a high speed operation, it is effective to widen a channel width so as to enlarge the ON current. However, if the channel width is widened, the leakage current correspondingly increases, and therefore, becomes difficult to hold the signal voltage. For example, the sample-and-hold circuit is required to have a feature that the sampling time is as short as possible but the holding time is as long as possible. However, this request and other various requests occurring with the speed-up of the circuit cannot be satisfied by the conventional countermeasures.

SUMMARY OF THE INVENTION

Accordingly, it is an object of the present invention to provide an analog switch which has overcome the above mentioned defect of the conventional one.

Another object of the present invention is to provide an analog switch which is composed of a thin film transistor and which has a decreased leakage current.

The above and other objects of the present invention are achieved in accordance with the present invention by an analog switch comprising at least first and second thin film field effect transistors having their gate connected in common to a control terminal, current paths of the at least first and second thin film field effect transistors being connected in series between an input terminal and a capacitive load, and a voltage adjusting capacitive element connected to a common connection between the current paths of the at least first and second thin film field effect transistors.

In a preferred embodiment, at least one of the at least first and second thin film field effect transistors is an offset gate type MIS transistor. In addition, a feedthrough adjustment capacitive element is connected between the gate electrode of the thin film field effect transistor connected to the capacitive element and the end connected to the capacitive element, of the current path of the same thin film field effect transistor.

More specifically, each of the at least first and second thin film field effect transistors has a common semiconductor thin film formed on an insulating substrate and a gate electrode formed through a gate insulator film on the semiconductor thin film, and each of the capacitive load and the capacitive element has one electrode which is formed on the insulating substrate so as to interpose an interlayer insulating film and a conductive film between the one electrode and the insulating substrate The above and other objects, features and advantages of the present invention will be apparent from the following description of preferred embodiments of the invention with reference to the accompanying drawings.

DESCRIPTION OF THE PREFERRED EMBODIMENTS

Figure 1:
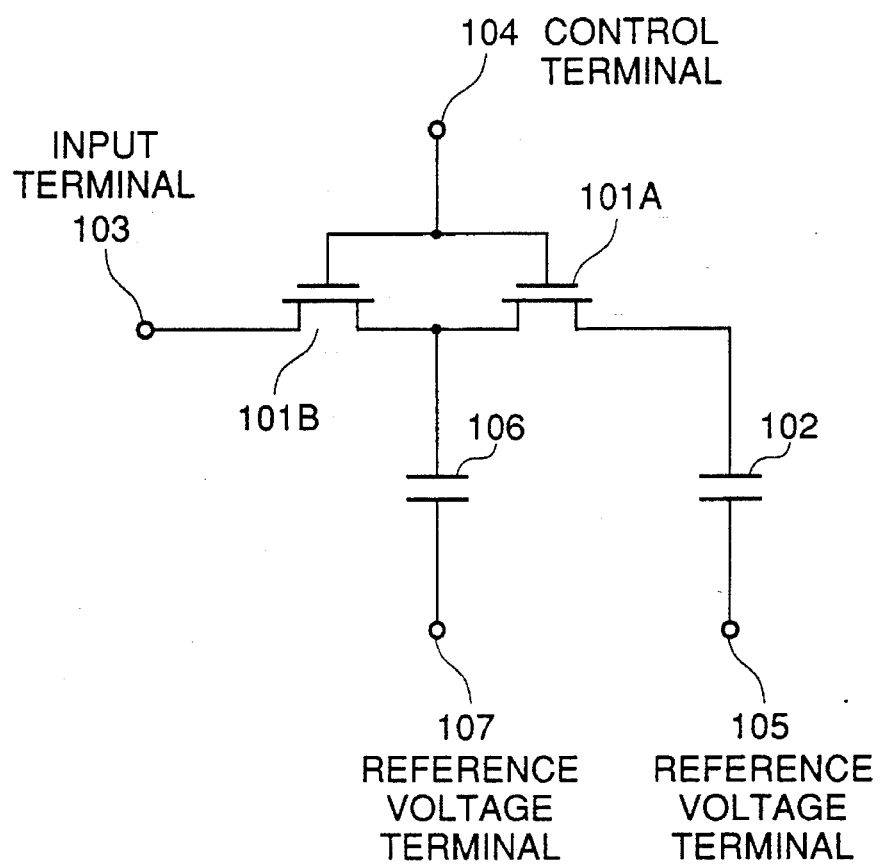
FIG. 1 is a circuit diagram of a first embodiment of the analog switch in accordance with the present invention.

Referring to FIG. 1, there is shown a circuit diagram of a first embodiment of the analog switch in accordance with the present invention.

The shown analog switch includes a first polysilicon thin film field effect transistor 101A and a second polysilicon thin film field effect transistor 101B, which have their gate connected in common to a control terminal 104. The first and second transistors 101A and 101B are cascaded in such a manner that a current path of the first transistor 101A is connected at its one end to one end of a current path of the second transistor 101B. A capacitive element (capacitor) 106 for a voltage adjustment is connected at its one end to a common connection point between the first and second transistors 101A and 101B. The other end of the capacitive element 106 is connected to a reference voltage terminal 107.

The analog switch having the construction as mentioned above is connected to a input terminal 103 and an capacitive load 102 in such a manner that the other end of the current path of the first transistor 101A is connected to one end of the capacitive load 102, and the other end of the current path of the second transistor 101B is connected to the input terminal 103. The other end of the capacitive load 102 is connected to a reference voltage terminal 107. When the analog switch is used in a liquid crystal display, the capacitive load 102 is formed of a capacitance of the liquid crystal, and the terminal 107 is a so called opposing electrode.

Figure 2A:
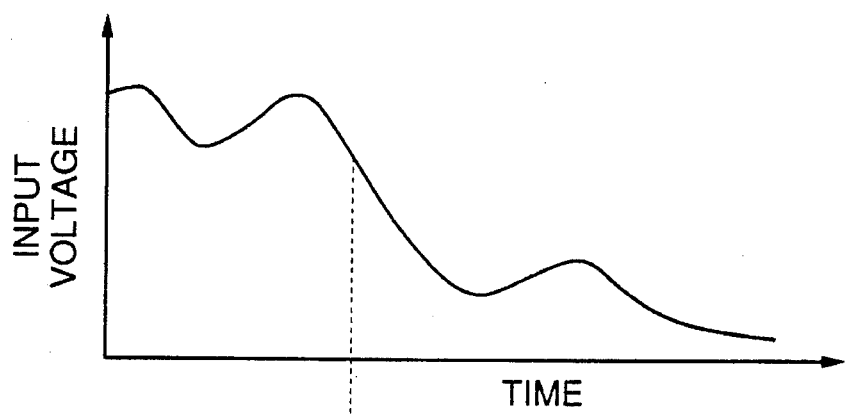
FIGS. 2A, 2B, 2C and 2D are waveform diagrams illustrating the operation of the first embodiment.
Figure 2B:
Figure 2C:
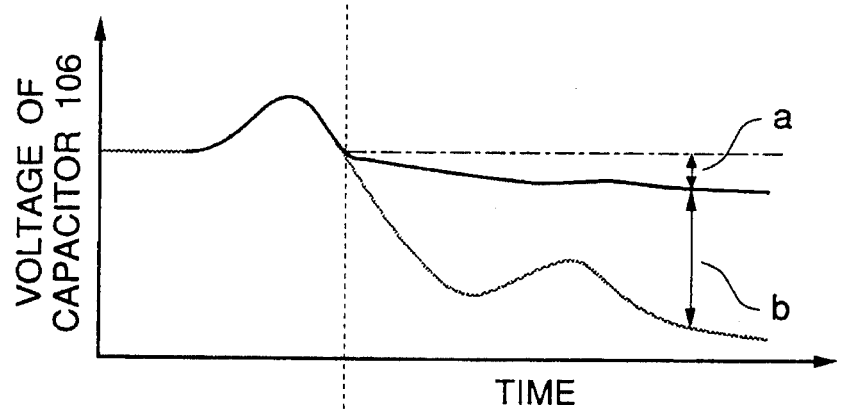
Figure 2D:
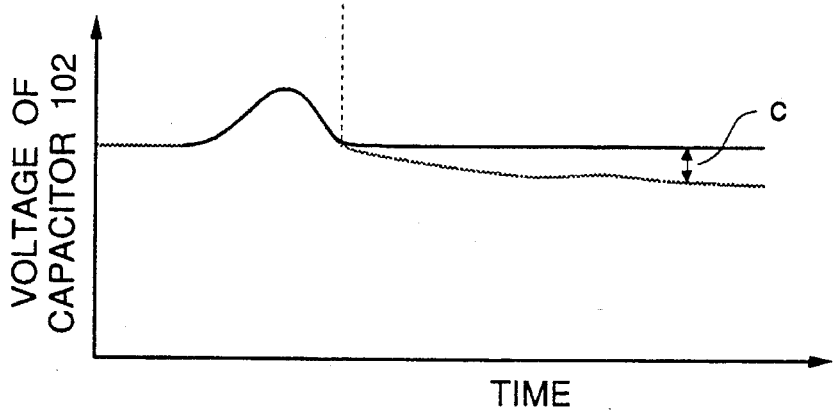

Now, operation of the analog switch shown in FIG. 1 will be described with reference to FIGS. 2A, 2B, 2C and 2D. FIG. 2A is a waveform diagram illustrating an input voltage, and FIG. 2B is a waveform diagram illustrating a gate pulse. FIG. 2C is a waveform diagram illustrating a voltage at the one end of the capacitive element 106 for the voltage adjustment, and FIG. 2D is a waveform diagram illustrating a voltage at the one end of the capacitive load 102.

Assume that an input voltage shown in FIG. 2A is applied to the input terminal 103 and a gate pulse shown in FIG. 2B is applied to the control terminal 104. In response to the gate pulse, the first and second transistors 101A and 101B are simultaneously turned on, so that the same voltage as the input voltage is written into the voltage adjustment capacitive element 106 and the capacitive load 102. Thereafter, when the gate voltage falls down, the first and second transistors 101A and 101B are simultaneously turned off, so that the input voltage just before these transistors are turned off is held in the voltage adjustment capacitive element 106 and the capacitive load 102.

Because the leakage current as mentioned hereinbefore of the polysilicon thin film field effect transistor when it is off, the voltage at the one electrode of the voltage adjustment capacitive element 106 will gradually lower with time, as shown in the solid line in FIG. 2C. In FIG. 2C, "a" indicates a difference between a voltage to be held and an actual voltage at the one electrode of the voltage adjustment capacitive element 106, and "b" shows a drain voltage of the second transistor 101B, namely, a difference between the input voltage and the actual voltage at the one electrode of the voltage adjustment capacitive element 106. Turning to the capacitive load 102, it holds the voltage which is substantially the same as the written voltage. In FIG. 2D, "c" indicates a drain voltage of the first transistor 101A, namely, a difference between the actual voltage at the one electrode of the voltage adjustment capacitive element 106 and the actual voltage at the one electrode of the capacitive load 102. As seen from FIG. 2D, the drain voltage of the first transistor 101A is very small, and the voltage difference "a" is substantially equal to the voltage difference "c". Therefore, only a drain voltage corresponding to the voltage difference caused by the leakage current of the transistor 101B is applied to the transistor 101A.

Figure 13:
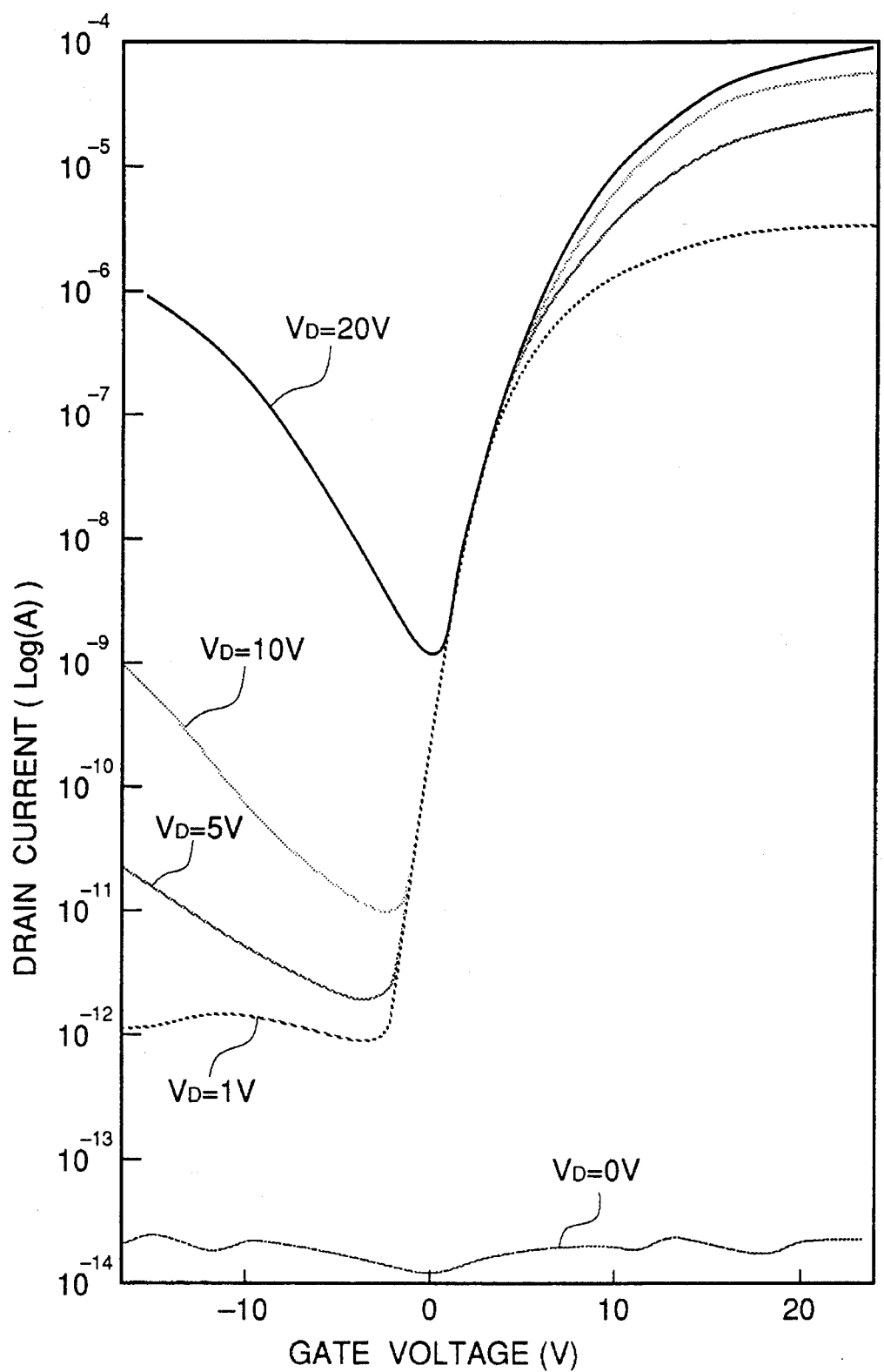
FIG. 13 is a graph illustrating a gate voltage—drain current characteristics of a typical polysilicon thin film field effect transistor.

Here, referring to FIG. 13, there is shown a graph illustrating a gate voltage—drain current characteristics of a typical polysilicon thin film field effect transistor. As seen from FIG. 13, when the drain voltage is zero or almost zero, the leakage current of the polysilicon thin film field effect transistor is extremely small on the order of for example $10^{-14}$ A, regardless of the gate voltage. Accordingly, no substantial leakage current occurs in the first transistor 101A, and therefore, the actual voltage at the one electrode of the capacitive load 102 will not substantially change. As a result, the voltage holding characteristics is remarkably improved.

Figure 3:
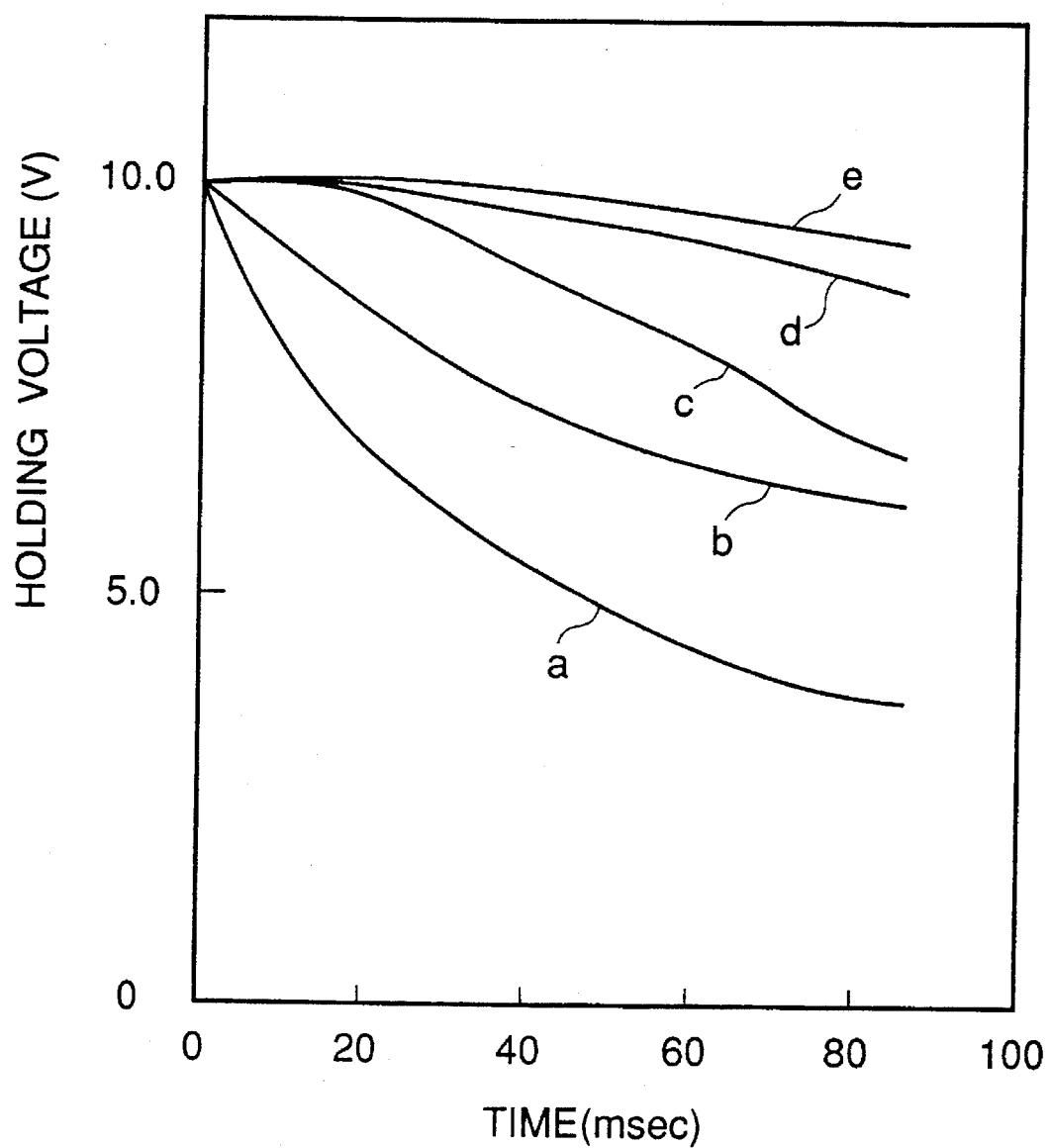
FIG. 3 is a graph illustrating the voltage holding characteristics when a voltage is written into a capacitive load through the analog switch.

Referring to FIG. 3, there is shown a graph illustrating the voltage holding characteristics when a voltage is written into a capacitive load through the analog switch.

Figure 14:
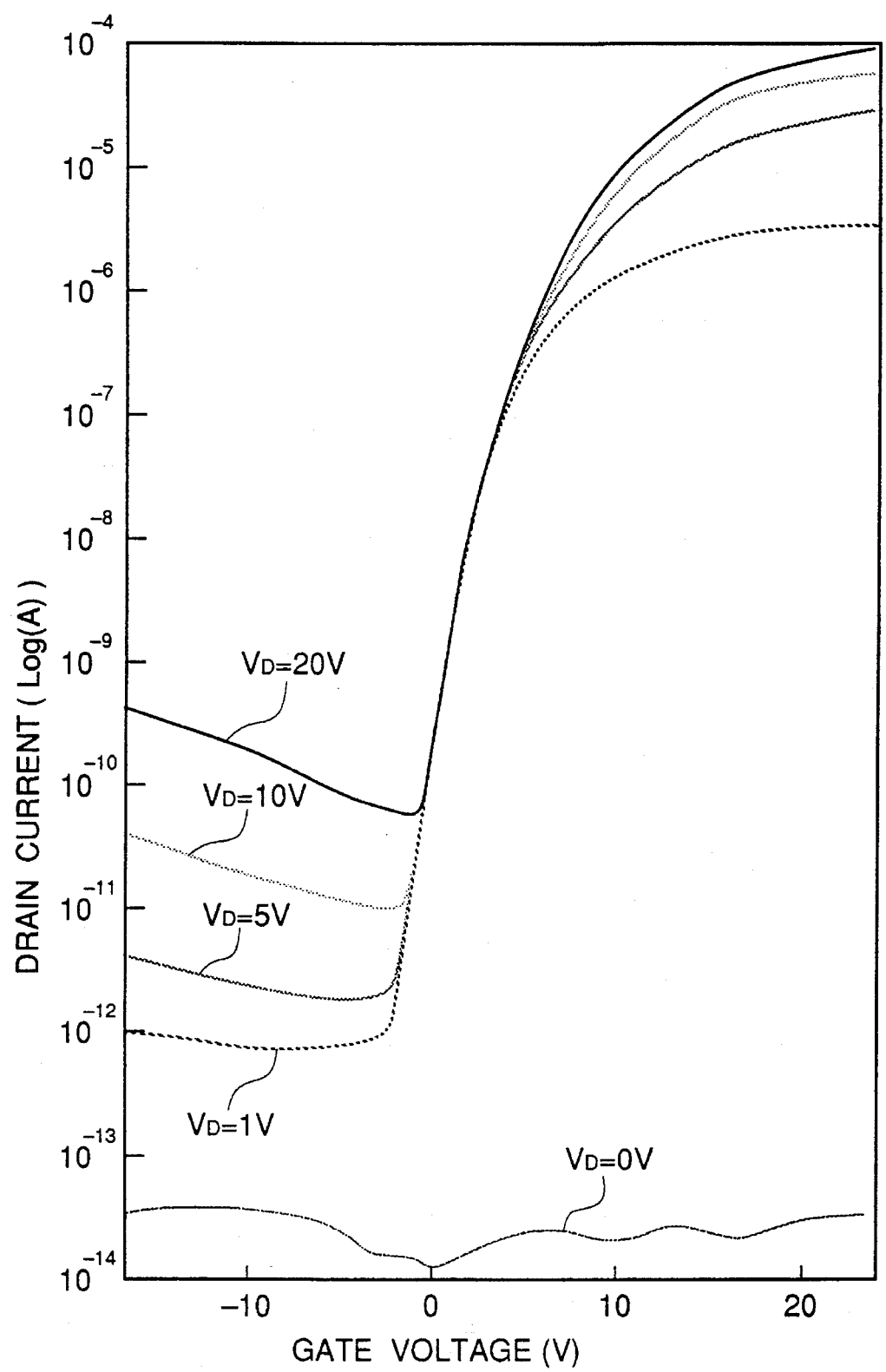
FIG. 14 is a graph illustrating a gate voltage—drain current characteristics of a typical triple-gate polysilicon thin film field effect transistor.

In FIG. 3, the curved line "a" shows the voltage holding characteristics of the conventional analog switch as mentioned hereinbefore formed of only one polysilicon thin film field effect transistor having the characteristics shown in FIG. 13, under the condition that the capacitive load has a capacitance of 0.15 pF and the input signal of 10 V is written. Here, the holding voltage is the voltage of the capacitive load. The curved line "b" indicates the voltage holding characteristics of the case in which the only one polysilicon thin film field effect transistor of the conventional analog is replaced with a so-called triple-gate polysilicon thin film field effect transistor having the characteristics shown in FIG. 14. Here, the triple-gate polysilicon thin film field effect transistor is formed of three polysilicon thin film field effect transistors having their gate electrode commonly connected to each other and their current path cascaded to form a series current path. The curved line "c" shows the voltage holding characteristics of the analog switch of the first embodiment in which each of the first and second transistors 101A and 101B has the characteristics shown in FIG. 13, and each of the capacitive load 102 and the voltage adjustment capacitive element 106 has a capacitance of 0.15 pF. In these examples, the capacitive load has a small capacitance so that a difference will clearly appear for comparison.

It would be noted from FIG. 3 that the analog switch of the triple-gate polysilicon thin film field effect transistor shown by the curved line "b" provides some degree of improvement in comparison with the curved line "a" of the analog switch provided with no countermeasure. Nevertheless, the holding voltage is still large in the analog switch of the triple-gate polysilicon thin film field effect transistor. For example, the degree of improvement is only in the extent that a 2% variation, which occurred at about 1 msec in the analog switch provided with no countermeasure, occurs at about 4 msec in the analog switch of the triple-gate polysilicon thin film field effect transistor. On the other hand, the voltage variation will be not greater than 2% until about 20 msec in the analog switch of the first embodiment. Namely, the voltage variation is suppressed to a remarkably low extent.

Figure 4A:
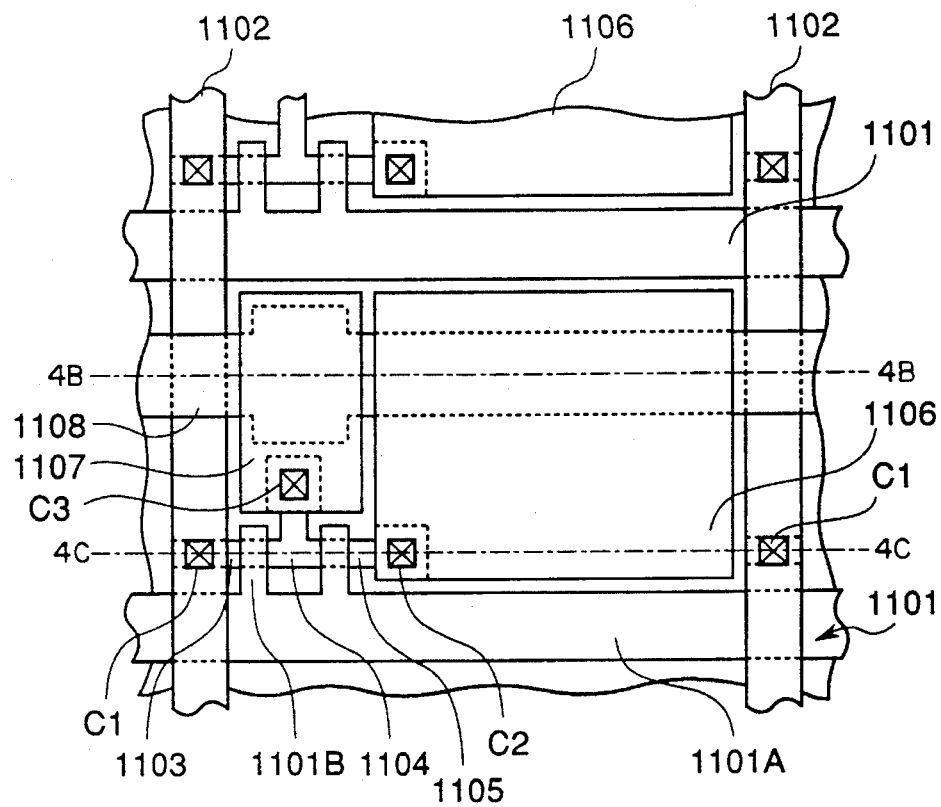
FIGS. 4A, 4B and 4C are a layout pattern diagram and sectional views of an active matrix type liquid crystal diagram incorporating therein the analog switch of the first embodiment.
Figure 4B:
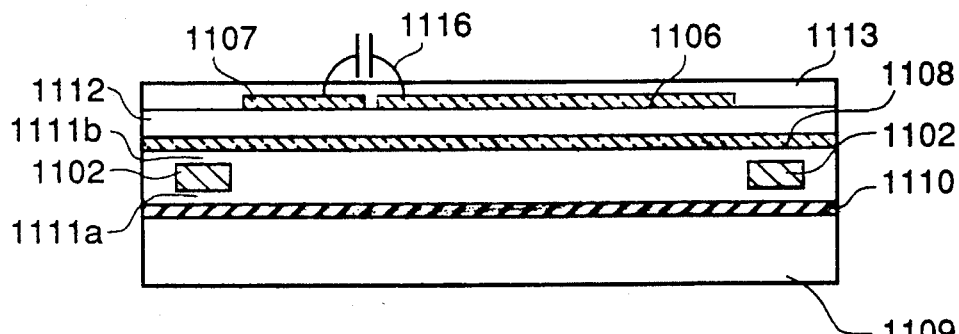
Figure 4C:
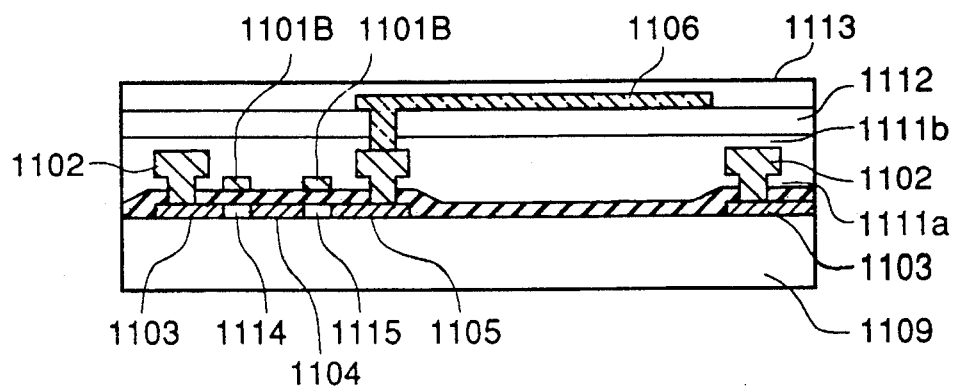

Referring to FIG. 4A, there is shown a layout pattern diagram of one pixel of an active matrix type liquid crystal diagram incorporating therein the analog switch of the first embodiment. FIGS. 4B and 4C are sectional views taken along the line A—A and the line B—B in FIG. 4A, respectively.

On a glass substrate 1109 there is formed a T-shaped polysilicon film (1103, 1114, 1104, 1115, 1105), which is covered with a gate insulator film 1110. A gate conductor (scan line) 1101 is formed on the gate insulator film 1110. This gate conductor 1101 includes a main conductor 1101A of a strip pattern in parallel to a horizontal portion of a T-pattern of the T-shaped polysilicon film, and two branch conductors 1101B extending therefrom perpendicularly to the main conductor so as to cross over the horizontal portion of a T-pattern of the T-shaped polysilicon film. Portions of the polysilicon film under the two branch conductors of the gate conductor 1101 constitute active layers 1114 and 1115, and the other portion of the polysilicon film are doped with phosphorus or arsenic at a high concentration so as to form source-drain regions 1103, 1104 and 1105.

A drain conductor (signal line) 1102 is formed through an interlayer insulating film 111a on the drain region 1103 and to extend perpendicularly to the main conductor 1101A of the gate conductor. The drain conductor 1102 is connected to the drain region 1103 through a contact hole C1. Simultaneously to formation of the drain conductor 1102, contact conductors are formed to connect through contact holes C2 and C3 to the source region 1105 and the source-drain region 1104.

A common electrode 1108 formed of a transparent conducting film is deposited through another interlayer insulating film 111b on the drain conductor 1102. Furthermore, still another interlayer insulating film 1112 is formed on the common electrode 1108, and a pixel electrode 1106 formed of a transparent conducting film and one electrode plate 1107 of the voltage adjusting capacitive element (106 in FIG. 1) are formed on the interlayer insulating film 1112.

The pixel electrode 1106 is connected through the contact hole C2 to the source region 1105, and the electrode plate 1107 is connected through the contact hole C3 to the source-drain region 1104. On the pixel electrode 1106 and the electrode plate 1107, a liquid orientation processing film 113 formed of polyimide or another is deposited.

For simplification of the drawings, there are omitted from FIG. 4 and the other drawings a transparent electrode formed on an active matrix substrate, a color filter provided thereon, a liquid crystal deposited on liquid orientation processing film of an opposing substrate, which are provided in an actual active matrix liquid crystal display.

In the active matrix liquid crystal display as mentioned above, the first embodiment of the analog switch is incorporated. Namely, the drain conductor 1102 corresponds to the input terminal 103, and the gate conductor 1101 corresponds to the control terminal 104. The first transistor 101A is formed of the drain region 1104, the active region 1115 and the source region 1105, and the second transistor 101B is formed of the drain region 1103, the active region 1114 and the source region 1104. A capacitance formed by the pixel electrode 1106, the interlayer insulator film 1112 and the common electrode 1108 forms a portion of the capacitive load 102, and a capacitance formed by the electrode plate 1107, the interlayer insulator film 1112 and the common electrode 1108 forms the capacitive element 107 for the voltage adjustment. The other portion of the capacitive load 102 is formed of a capacitance formed by the pixel electrode 1106, and the liquid crystal and the opposing electrode (not shown). In this example, the terminals 105 and 107 are formed of the common electrode 1108 and therefore, common to each other.

Figure 5:
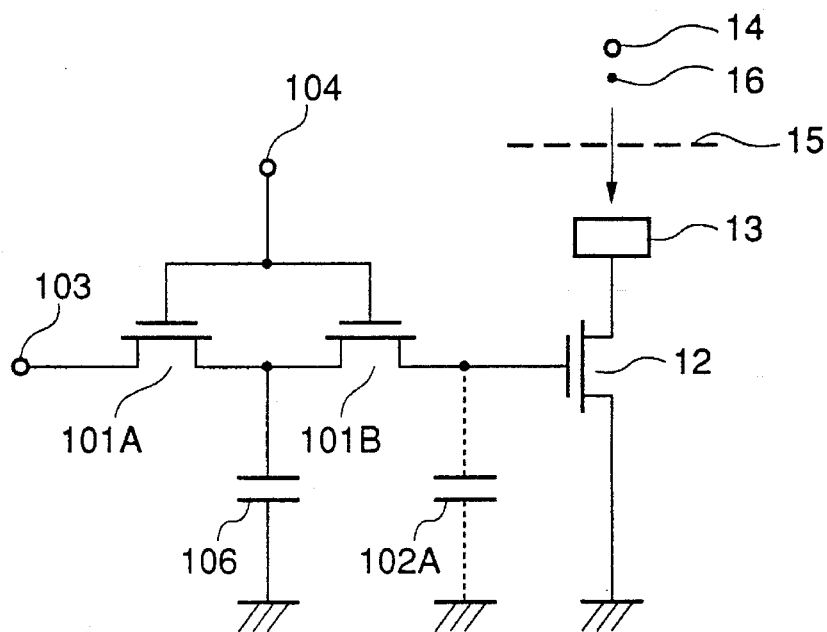
FIG. 5 is an equivalent circuit diagram of one pixel of the vacuum fluorescent display panel incorporating therein the analog switch of the first embodiment.

Turning to FIG. 5, there is shown an equivalent circuit diagram of one pixel of the vacuum fluorescent display panel incorporating therein the analog switch of the first embodiment. In FIG. 5, elements similar to those shown in FIG. 1 are given the same Reference Numerals, and explanation thereof will be omitted.

In FIG. 5, Reference Numeral 13 designates a phosphor, and Reference Numerals 14 and 15 designate a cathode and a grid, respectively. When the cathode 14 is heated, an electron 16 is emitted from the cathode 14, and attracted by a positive potential of the grid 15 and the phosphor 13 so that the electron 16 reaches the phosphor 13. As a result, light is emitted from the phosphor 13.

The other end of the first transistor 101A is connected to a gate of a thin film transistor 12, and a gate capacitance 102A of the transistor 12 constitutes a capacitive load 102 of FIG. 1. Thus, a voltage written into the gate capacitance 102A through the analog switch controls the thin film transistor 12. A current path of the thin film transistor 12 is connected between the phosphor 13 and the ground.

All the above mentioned elements are sealed within a vacuum enclosure. Brightness is controlled by controlling a current flowing through the thin film transistor 12.

In the above mentioned vacuum fluorescent display panel, the number of scan lines in the matrix is determined dependently upon how long the signal voltage stored in the gate capacitance 102A is maintained. Therefore, the analog switch in accordance with the present invention is very effective in increasing the number of scan lines.

Figure 6:
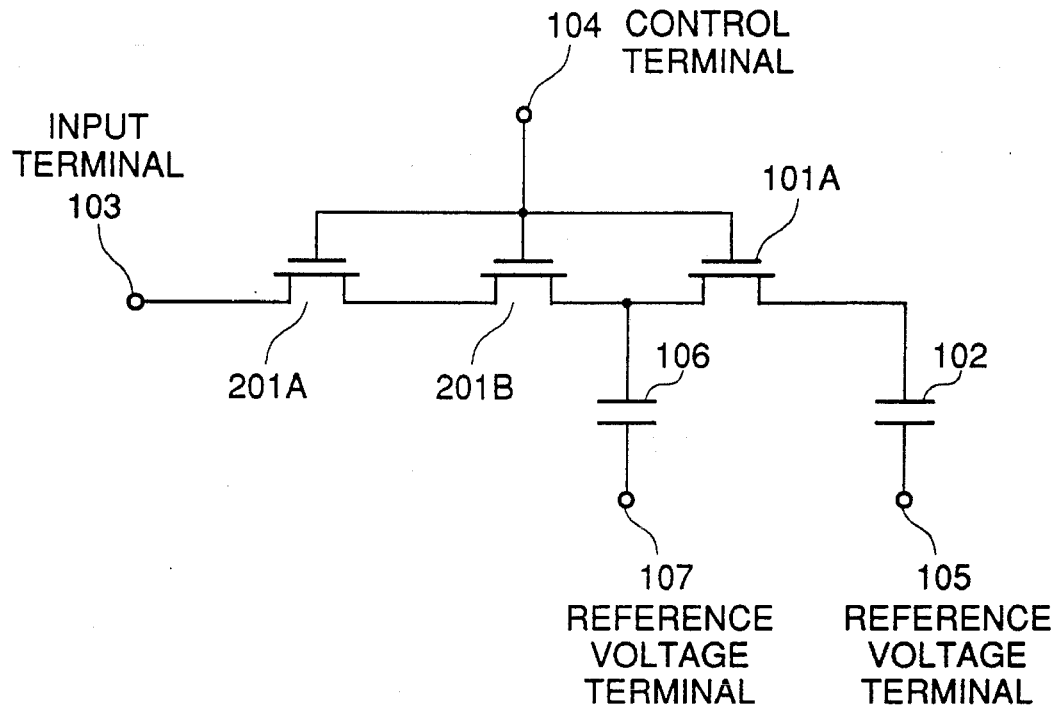
FIGS. 6, 7 8 and 9 are circuit diagrams of second, third, fourth and fifth embodiments of the analog switch in accordance with the present invention.

Referring to FIG. 6, there is a circuit diagram of a second embodiment of the analog switch in accordance with the present invention. In FIG. 6, elements similar to those shown in FIG. 1 are given the same Reference Numerals, and explanation thereof will be omitted.

As seen from comparison between FIGS. 1 and 6, the second embodiment is characterized in that the second transistor 101B of the first embodiment is replaced by a double gate polysilicon thin film field effect transistor composed of polysilicon thin film field effect transistors 201A and 201B having their commonly connected gate connected to the control terminal 104 and their current path connected in series to each other and connected in series to the current path of the first transistor 101A. With this arrangement, the leakage current is further reduced. The curved line "d" in FIG. 3 shows the voltage holding characteristics of the second embodiment. The 2% variation occurs about 30 msec, and the time until the variation reaches 2% is made one and half times that of the first embodiment.

Figure 7:
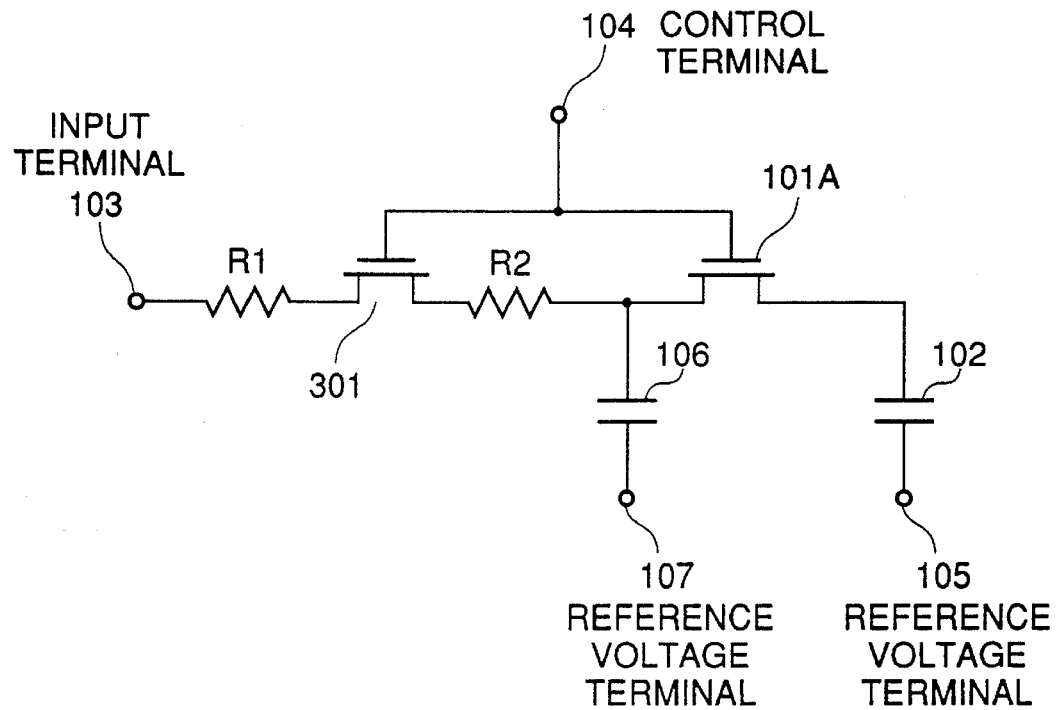

Turning to FIG. 7, there is a circuit diagram of a third embodiment of the analog switch in accordance with the present invention. In FIG. 7, elements similar to those shown in FIG. 1 are given the same Reference Numerals, and explanation thereof will be omitted.

As seen from comparison between FIGS. 1 and 7, the third embodiment is characterized in that the second transistor 101B of the first embodiment is replaced by a so called offset-gate type polysilicon thin film field effect transistor composed of a polysilicon thin film field effect transistor 301 having its gate connected to the control terminal 104 and its current path connected at its one end through a resistor R1 to the input terminal 103 and at its other end through a resistor R2 to the current path of the first transistor 101A. In this third embodiment, the first transistor 101A can be modified into the offset-gate type in place of the transistor 301.

In the first embodiment, both of the first and second transistors can be modified into the offset-gate type. In addition, the second embodiment, at least one of the transistors 101A, 201A and 201B can be modified into the offset-gate type.

Figure 8:
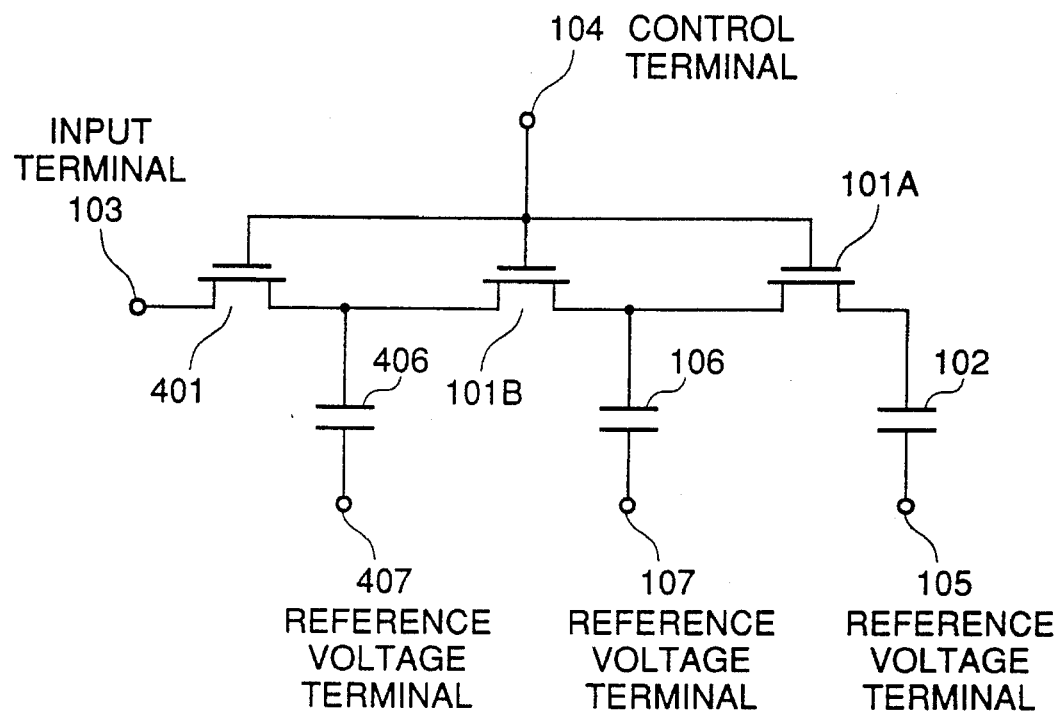

Referring to FIG. 8, there is a circuit diagram of a fourth embodiment of the analog switch in accordance with the present invention. In FIG. 8, elements similar to those shown in FIG. 1 are given the same Reference Numerals, and explanation thereof will be omitted.

As seen from comparison between FIGS. 1 and 8, the fourth embodiment is characterized in that a second voltage adjustment capacitive element 406 and a third thin film transistor 401 are added to the first embodiment. A current path of the third thin film transistor 401 is connected between the input terminal 103 and the second thin film transistor 101B, and a gate of the third thin film transistor 401 is connected to the control terminal 104. The second voltage adjustment capacitive element 406 is connected between a reference voltage terminal 407 and the common connection node between the second and third transistors 101B and 401.

When the gate pulse is applied to the control terminal 104, the signal voltage applied to the input terminal 103 is simultaneously written to the capacitive elements 406, 106 and 102. On the other hand, when the gate voltage falls down, the transistors 401, 101B and 101A are turned off. In this situation, the voltage of the capacitive elements 406, 106 and 102 will change in accordance with the leakage current of the respective turned-off transistors. Similarly to the first embodiment, the voltage adjustment capacitive elements 406 and 106 suppress the drain voltage of the first and second thin film transistors 101B and 101A to an extremely small value, so that the leakage current of the first transistor 101A becomes extremely small. The curved line "e" in FIG. 3 shows the voltage holding characteristics of the fourth embodiment. The time until the hold voltage variation reaches 2% is elongated to about 50 msec.

Figure 9:
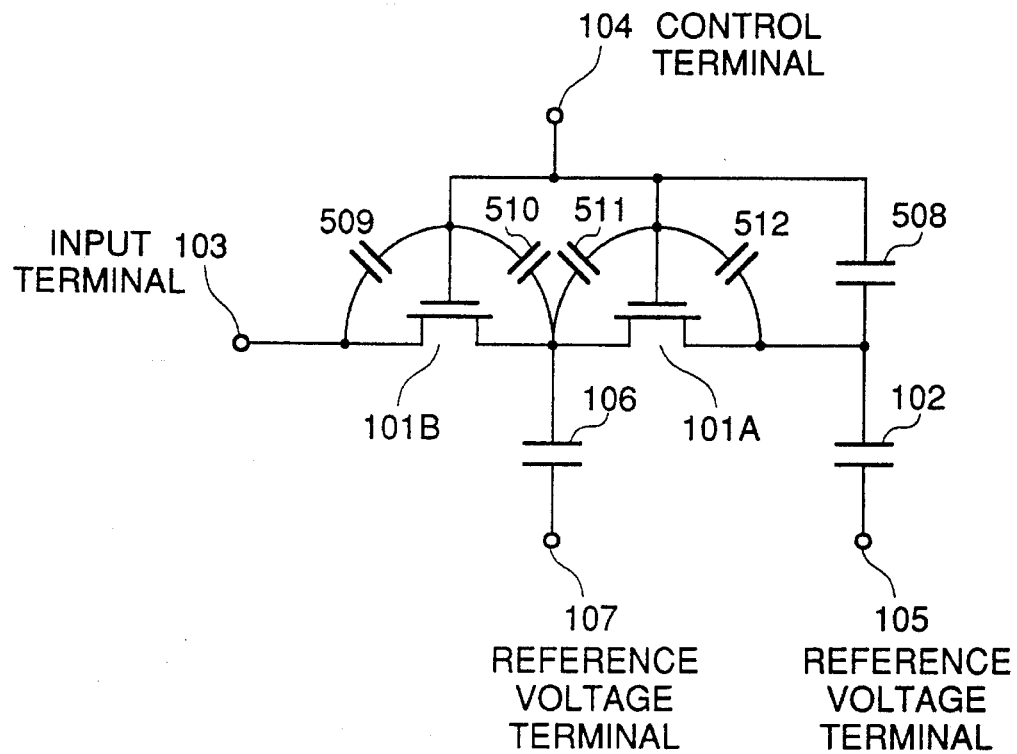

Referring to FIG. 9, there is a circuit diagram of a fifth embodiment of the analog switch in accordance with the present invention. In FIG. 9, elements similar to those shown in FIG. 1 are given the same Reference Numerals, and explanation thereof will be omitted.

As seen from comparison between FIGS. 1 and 9, the fifth embodiment is characterized in that a feedthrough adjustment capacitive element 508 is connected between the gate and the source of the first transistor 101 A in the first embodiment.

In the explanation made above, a parasitic capacitance formed between the gate electrode and the source electrode and the drain electrode has been neglected. In some cases, it cannot be neglected dependent upon the load capacitance, the parasitic capacitance and the size of the gate electrode. Therefore, influence of the parasitic capacitance will be now examined assuming that no feedthrough adjustment capacitive element 508 is connected in FIG. 9.

First, assume that the capacitance of the load 102 is CL, and the capacitance of the voltage adjustment capacitive element is CB. In addition, a gate-drain capacitance 509 of the second transistor 101B is CP1 and a gate-source capacitance 510 of the second transistor 101B is CP2. A gate-drain capacitance 511 of the first transistor 101A is CP3 and a gate-source capacitance 512 of the first transistor 101A is CP4. Furthermore, assume that the gate pulse voltage is VG and the signal voltage is VS and the thin film transistors have a threshold voltage of 0 V for simplification of consideration.

Figure 10A:
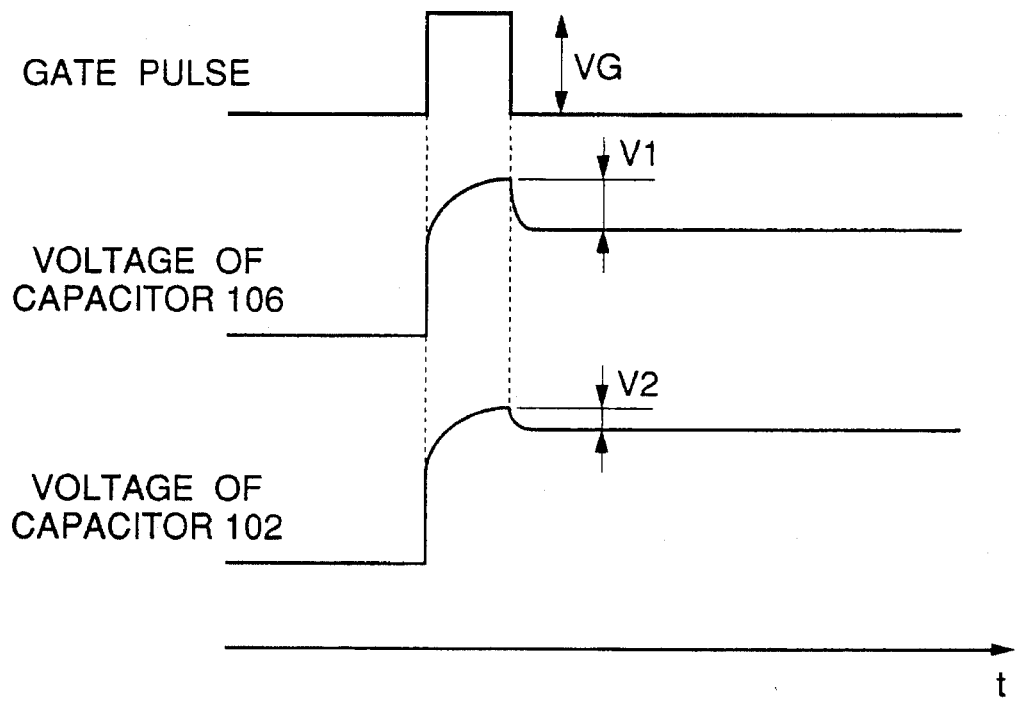
FIG. 10A is a waveform diagram illustrating the operation of the conventional analog switch with no feedthrough adjustment capacitive element.
Figure 10B:
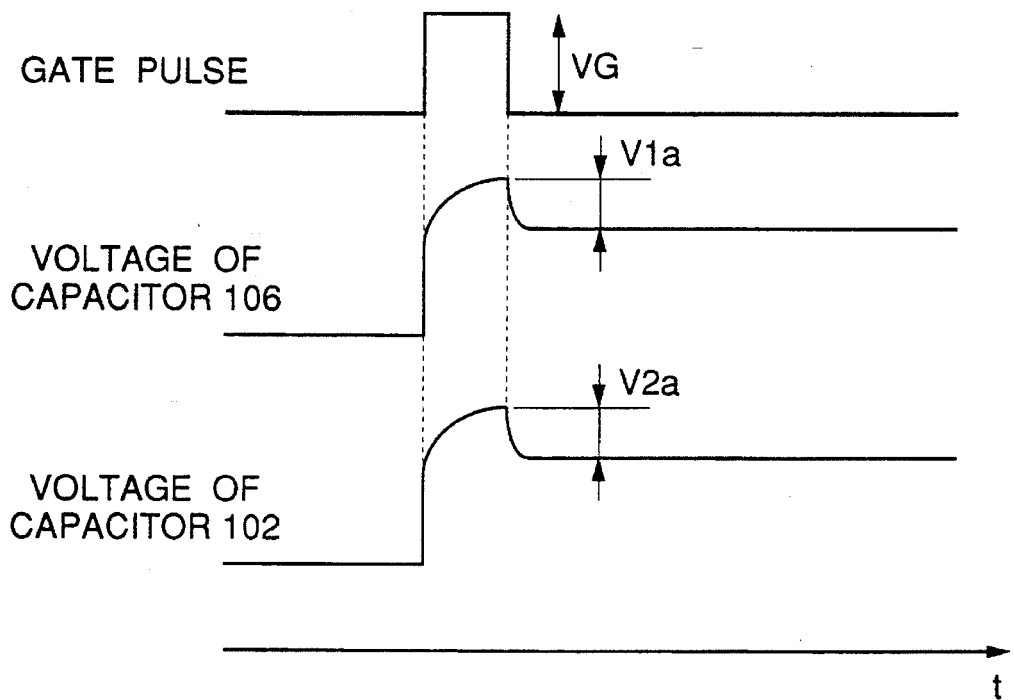
FIG. 10B is a waveform diagram illustrating the operation of the fifth embodiment.

When the gate voltage falls down from VG to 0 V, voltage variations V1 and V2 occur in the voltage of the capacitive elements 106 and 102 as shown in FIG. 10A because a feedthrough of the gate pulse through the parasitic capacitances. These voltage variations V1 and V2 can be expressed as follows:

V1=(VG−VS)·(CP2+CP3)/(CP2+ CP3+CB)

V2=(VG−VS)·CP4/(CP4+CL)

The voltage applied across the first transistor 101A is a difference between V1 and V2. Therefore, V1=V2 is ideal. However, considering a most general case in which the two thin film transistors are the same in size (CP1=CP2=CP3=CP4=CP, at least CP1=CP2 and CP3=CP4) and the capacitive load and the voltage adjustment capacitive element have the same capacitance (CL=CB=C),

V1=(VG−VS)·2CP/(2CP+C)

V2=(VG−VS)·CP/(CP+C)

Since C is ordinarily greatly larger than CP, V1 is substantially a double of V2. Therefore, the drain voltage substantially corresponding to V1 is applied to the first transistor. In order to realize V1=V2 while maintaining the circuit construction having no capacitor 508, it is necessary to make CB to a double of CL. This can be realized only to the extent that no problem occurs in the operation speed. Generally, CB is preferred to be as small as possible.

Next, the case having the feedthrough adjustment capacitive element 508 will be examined. Assuming that the capacitive element 508 has a capacitance of CF, voltage variations V1a and V2a in the voltage of the capacitive elements 106 and 102 are considered similarly to the above case.

V1a=(VG−VS)·(CP2+CP3)/(CP2 +CP3+CB)

V2a=(VG−VS)·(CP4+CF)/(CP4+CF+ CL)

Here, assuming CP1=CP2=CP3=CP4= CP and CL=CB=C, and also assuming CF=CP3, $V1a=V2a=(VG-VS)\cdot 2CP/(2CP+C)$.

In this case, the operation speed is hardly influenced with CP. Accordingly, the increase of the leakage current due to the parasitic capacitance can be prevented with giving no adverse effect to the operation speed.

This embodiment is very effective when the capacitance of the capacitive load is small in view of the parasitic capacitance o the thin film transistors. For example, assume that the parasitic capacitance CP is 5 fF and the capacitance of the capacitive load and the voltage adjustment capacitive element is 50 fF and that the gate voltage is 15 V and the signal voltage is 5 V. In the case having no capacitive element 508, V1 is 1.67 V and V2 is 0.9 V. Namely, 0.77 V is applied across the first thin film transistor. It would be noted from FIG. 13 that the leakage current increases to about 10 times. This gives the voltage hold characteristics higher than the prior art, but only improvement of about a few times. On the other hand, if the capacitive element 508 having the capacitance of 5 fF is connected between the gate and the capacitive load, V2a also becomes 1.67 V. Accordingly, no voltage is applied to the first thin film transistor at an initial stage of the signal holding condition, and an ultimate effect of the present invention can be obtained.

Figure 11A:
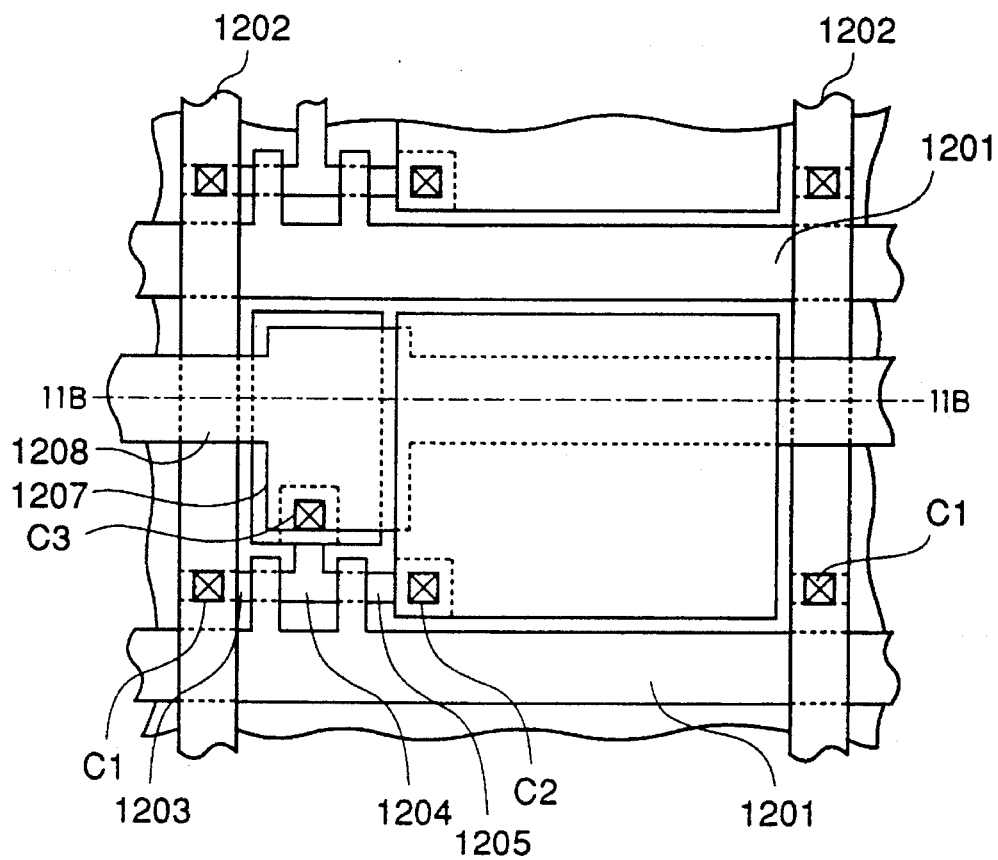
FIGS. 11A and 11B are a layout pattern diagram and a sectional view of an active matrix type liquid crystal diagram incorporating therein the analog switch of a sixth embodiment.
Figure 11B:
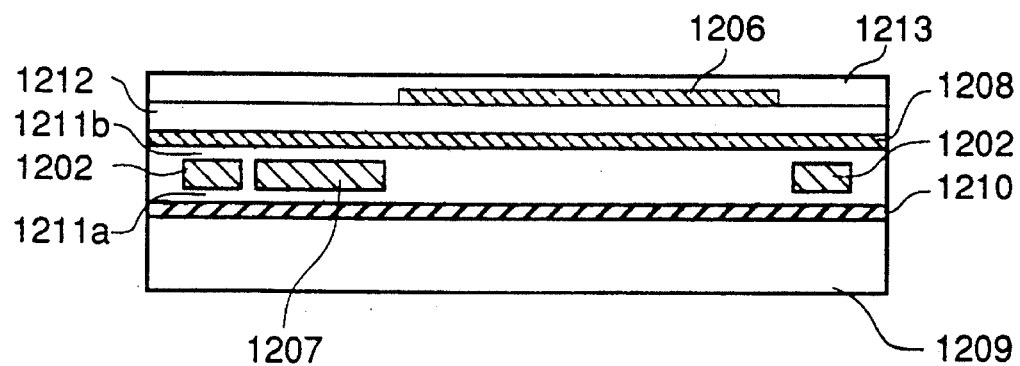

Referring to FIG. 11A, there is shown a layout pattern diagram of an active matrix type liquid crystal diagram incorporating therein the analog switch of a sixth embodiment. FIG. 11B is a sectional view taken along the line C—C in FIG. 11A. In FIGS. 11A and 11B, elements similar to those shown in FIGS. 4A, 4B and 4C are given the Reference Numerals obtained by adding 100 to the Reference Numerals in FIGS. 4A, 4B and 4C, and only elements differing from the embodiment shown in FIGS. 4A, 4B and 4C will be explained.

The sixth embodiment is characterized in that one electrode plate 1207 of the voltage adjustment capacitive element is formed on the interlayer insulating film 1211a. This electrode plate 1207 is deposited simultaneously to formation of the drain conductor 1202, and is formed of aluminum. Therefore, the electrode plate 1207 is positioned at the side of the common electrode 1208 opposite to the pixel electrode 1206. Therefore, the common electrode 1208 functions as a shield electrode, and accordingly, there is no capacitance corresponding to an interplate capacitance 1116.

In the embodiment shown in FIG. 4, it is necessary to locate the common electrode 1108 so as to avoid the contact hole C3. This attention is not necessary in the embodiment of FIGS. 11A and 11B, and therefore, it is possible to enlarge the area of the common electrode. Accordingly, the capacitance of the voltage adjustment capacitive element can be increased. This very effective in decrease the leakage current.

In the sixth embodiment, furthermore, since no coupling occurs between the voltage adjustment capacitive element and the capacitive load, the voltage of these elements does not change, and therefore, the characteristics is stabilized.

Figure 12A:
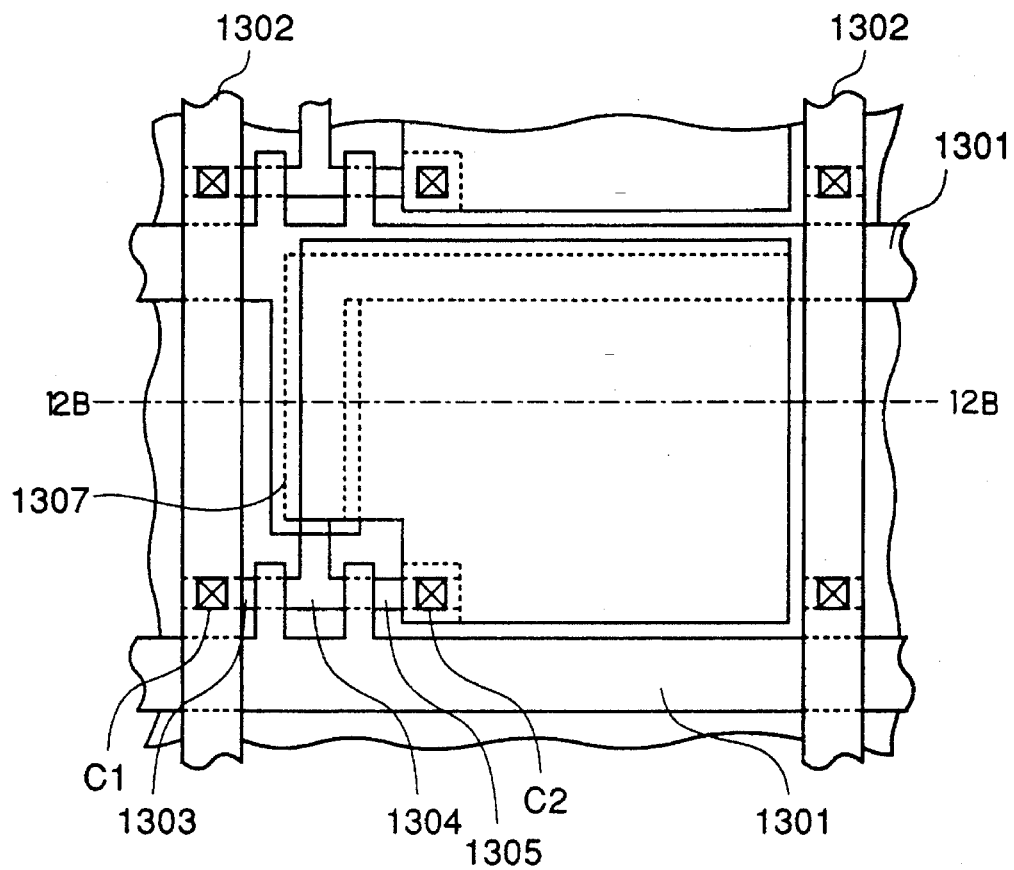
FIGS. 12A and 12B are a layout pattern diagram and a sectional view of an active matrix type liquid crystal diagram incorporating therein the analog switch of a seventh embodiment.
Figure 12B:
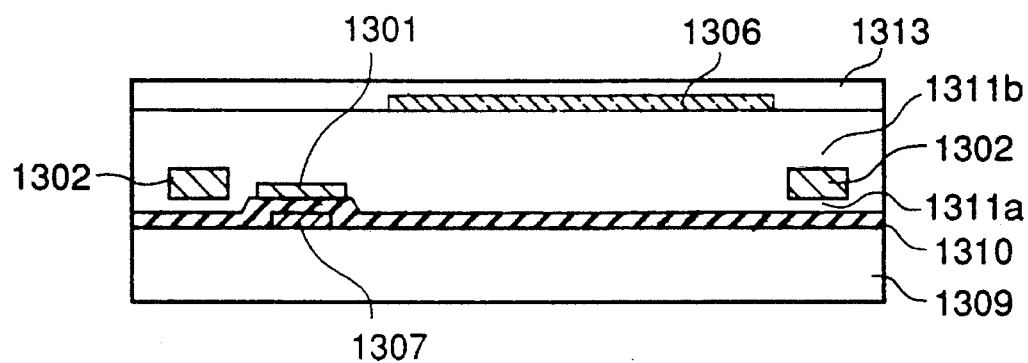

Referring to FIG. 12A, there is shown a layout pattern diagram of an active matrix type liquid crystal diagram incorporating therein the analog switch of a seventh embodiment. FIG. 12B is a sectional view taken along the line D—D in FIG. 12A.

In FIGS. 12A and 12B, Reference Numeral 1301 designates a gate conductor, and Reference Numeral 1302 designates a drain conductor. Reference Numerals 1303, 1304 and 1305 designate polysilicon thin films of the thin film transistor doped with impurity at a high concentration. Reference Numeral 1306 designates a pixel electrode formed of a transparent conductive film, and Reference Numeral 1307 designates one electrode plate of the voltage adjustment capacitive element. This electrode plate 1307 is formed of an extension of the doped polysilicon thin film 1304. Reference Numeral 1308 designates a glass substrate, and Reference Numeral 1309 designates a gate insulator film. Reference Numeral 1310 designates an interlayer insulating film, and Reference Numeral 1311 designates a liquid crystal orientation processing film.

In the seventh embodiment, the gate electrode of a preceding pixel is used as the reference voltage terminal of the voltage adjustment capacitive element and as the reference voltage terminal of the capacitive load. Therefore, similarly to the sixth embodiment, the pixel electrode 1306 and the electrode plate 1307 of the voltage adjustment capacitive element are shielded from each other by the gate electrode. Accordingly, since no coupling occurs between the voltage adjustment capacitive element and the capacitive load, the voltage of these elements does not change.

As mentioned above, in the sixth and seventh embodiments, the capacitive coupling is prevented. An influence of the interelectrode capacitance is dependent upon the load capacitance, the area of the device, and other various factors, and therefore, cannot be easily explained. However, the influence of the interelectrode capacitance can be made completely zero in these embodiments. In addition, the electrodes shielded from each other are not simultaneously formed in the same step of a manufacturing process, and therefore, possibility of short-circuiting between the electrodes becomes small.

The above mentioned embodiments have been formed of the polysilicon thin film transistors. However, a similar problem of leakage current will occur in transistors formed of other polycrystalline materials such as cadmium sulfide. Therefore, the present invention can be similarly applied.

The invention has thus been shown and described with reference to the specific embodiments. However, it should be noted that the present invention is in no way limited to the details of the illustrated structures but changes and modifications may be made within the scope of the appended claims.

I claim:

1. An analog switch comprising at least first and second thin film field effect transistors each having a gate electrode directly connected in common to a control terminal, source-drain paths of said at least first and second thin film field effect transistors being directly connected in series to each other between an input terminal and a capacitive load, and a voltage adjusting capacitive element directly connected to a common connection between said source-drain current paths of said at least first and second thin film field effect transistors.

2. An analog switch claimed in claim 1 wherein at least one of said at least first and second thin film field effect transistors is an offset gate type MIS transistor.

3. An analog switch claimed in claim 1 further including a feedthrough adjustment capacitive element connected between said gate electrode of said second thin film field effect transistor and said capacitive load, which is connected to said source-drain path of said second thin film field effect transistor.

4. An analog switch claimed in claim 1 further including a third thin film transistor having its gate connected to said control terminal and its current path connected at its one end to said input terminal and at its other end connected in series to the series-connected current paths of said at least first and second thin film field effect transistors, and another voltage adjusting capacitive element connected to the other end of the current path of said third thin film field effect transistor.

5. An analog switch comprising:

at least first and second thin film field effect transistors each having a gate electrode connected in common to a control terminal, source-drain current paths of said at least first and second thin film field effect transistors being connected in series to each other between an input terminal and a capacitive load; and a voltage adjusting capacitive element connected to a common connection between said source-drain current paths of said at least first and second thin film field effect transistors;

wherein each of said at least first and second thin film field effect transistors has a common semiconductor thin film formed on an insulating substrate, wherein said gate electrode of each of said at least first and second thin film field effect transistors is formed on a gate insulator film on said semiconductor thin film, and wherein each of said capacitive load and said capacitive element has one electrode which is formed on said insulating substrate so as to interpose and interlayer insulating film and a conductive film between the one electrode and said insulating substrate.

* * * * *